(12) United States Patent
Na et al.

(10) Patent No.: US 10,886,436 B2
(45) Date of Patent: Jan. 5, 2021

(54) LIGHT-EMITTING DEVICE AND LIGHTING APPARATUS

(75) Inventors: MinGyu Na, Seoul (KR); SungKyoon Kim, Seoul (KR); SungHo Choo, Seoul (KR); WooSik Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/108,078

(22) Filed: May 16, 2011

(65) Prior Publication Data

US 2011/0278634 A1    Nov. 17, 2011

(30) Foreign Application Priority Data

May 17, 2010 (KR) .......................... 10-2010-0046109

(51) Int. Cl.
  *H01L 33/38*    (2010.01)
  *H01L 33/20*    (2010.01)
(52) U.S. Cl.
  CPC .............. *H01L 33/38* (2013.01); *H01L 33/20* (2013.01); *H01L 2224/48091* (2013.01); *H01L 2224/48247* (2013.01)
(58) Field of Classification Search
  CPC ....................................................... H01L 33/38
  USPC ........................................... 257/99, E33.065
  See application file for complete search history.

(56) References Cited

U.S. PATENT DOCUMENTS

2007/0096115 A1*  5/2007  Lee et al. ..................... 257/79
2007/0228388 A1  10/2007  Ko et al.

2008/0210972 A1  9/2008  Ko et al.
2009/0140280 A1  6/2009  Shen et al.
2010/0059765 A1  3/2010  Lester et al. ................ 257/79

FOREIGN PATENT DOCUMENTS

| | | |
|---|---|---|
| CN | 1953225 A | 4/2007 |
| EP | 2 001 061 A2 | 12/2008 |
| KR | 10-2007-0041847 A | 4/2007 |
| KR | 10-0708934 B1 | 4/2007 |

OTHER PUBLICATIONS

Korean Office Action dated Jul. 26, 2011 issued in Application No. 10-2010-0046109.
Chinese Office Action dated Apr. 28, 2013 issued in Application No. 201110130178.4 (with English translation).
Chinese Office Action issued in related foreign application No. 201110130178.4 dated Jun. 25, 2014.
European Search Report issued in Application No. 11166300.1 dated Mar. 17, 2015.

* cited by examiner

*Primary Examiner* — Hsin Yi Hsieh
(74) *Attorney, Agent, or Firm* — KED & Associates LLP

(57) ABSTRACT

A light-emitting device may include a light-emitting structure, a first electrode formed on the first conductive semiconductor layer, and a second electrode formed on the second conductive semiconductor layer. The first electrode may include a first pad, and a first branch coupled to the first pad and extending in a longitudinal direction. The second electrode may include a second pad, and a third branch and a fourth branch that are connected to the second pad and extend from the second pad.

1 Claim, 13 Drawing Sheets

500

LIGHT-EMITTING DEVICE AND LIGHTING APPARATUS

CROSS-REFERENCE TO RELATED APPLICATION

This application claims the priority benefit of Korean Patent Application No. 10-2010-0046109, filed on May 17, 2010 in the Korean Intellectual Property Office, the disclosure of which is incorporated herein by reference.

BACKGROUND OF THE INVENTION

1. Field of the Invention

The present embodiment relates to a light-emitting device and a lighting system.

2. Description of the Related Art

A light-emitting diode (LED) is a device which converts electric signals into light using characteristics of compound semiconductors. LEDs are now being applied to devices such as home appliances, remote controls, electronic signboards, displays, a variety of automatic appliances and the like and their application range continues to expand.

Generally, a miniaturized LED is fabricated as a surface mount device such that it can be directly mounted to a printed circuit board (PCB). Accordingly, an LED lamp used as a display device is also developed in a surface mount device-type. Such a surface mount device may substitute for a conventional lamp and is used as lighting displays, character displays, image displays and the like, rendering various colors.

As the application range of LEDs widens, brightness required for lights in daily use and lights for structural signals increases. Accordingly, it is important to increase luminous brightness of LEDs.

Therefore, in order to improve luminous brightness, a great deal of research is has focused upon fabrication of nitride semiconductor light-emitting devices capable of uniformly diffusing current and thereby improving luminous efficacy.

SUMMARY OF THE INVENTION

Therefore, the present embodiments have been made in view of the above problems, and it is to provide a light-emitting device, wherein disparity of current diffusion caused by the difference in doping concentration between first and second conductive semiconductor layers can solved and luminous efficacy can be thus improved by varying the distance between one of two or more branches formed on the second conductive semiconductor layer, and a mesa line to separate the first and second conductive semiconductor layers from each other.

In accordance with one aspect of the present embodiments, the above and other embodiments can be accomplished by the provision of a light-emitting device comprising a light-emitting structure including a first conductive semiconductor layer including at least a first region and a second region, and an active layer and a second conductive semiconductor layer formed in the first region; a first electrode formed on the first conductive semiconductor layer; and a second electrode formed on the second conductive semiconductor layer, wherein the second region includes: a third region formed on at least one side of the light-emitting structure in a horizontal direction of the light-emitting structure; and a fourth region formed inside the light-emitting structure in a horizontal direction of the light-emitting structure, the first electrode includes: a first pad on one side of the first conductive semiconductor layer in a longitudinal direction of the first conductive semiconductor layer; and a first branch which is formed in the fourth region, is connected to the first pad and extends in the longitudinal direction of the first conductive semiconductor layer, the second electrode includes: a second pad on the other side of the second conductive semiconductor layer in a longitudinal direction of the second conductive semiconductor layer; and a third branch and a fourth branch which are connected to the second pad and extend in the first pad direction, wherein the first branch is spaced from a first mesa line to separate the fourth region from the first region, by a first distance, at least one of the third and fourth branches is spaced from a second mesa line to separate the third region from the first region by a second distance, and the second distance is greater than the first distance.

The third and fourth branches may be symmetrical to each other, based on the first branch.

The distance between the first branch and the third branch may be the same as the distance between the first branch and the fourth branch.

The second distance may be 3% to 15% of the horizontal length of the light-emitting structure.

The second distance may be 20 μm to 80 μm.

The second distance may be 35 μm to 50 μm.

The at least one of the third and fourth branches may include a bend.

The bend may be curved.

In accordance with another aspect of the present embodiments, the above and other embodiments can be accomplished by the provision of a light-emitting device comprising a light-emitting structure including a first conductive semiconductor layer including at least a first region and a second region, and an active layer and a second conductive semiconductor layer formed in the first region; a first electrode formed on the first conductive semiconductor layer; and a second electrode formed on the second conductive semiconductor layer, wherein the second region includes: a third region formed on one side of the light-emitting structure in a horizontal direction of the light-emitting structure; a fourth region formed inside the light-emitting structure in a horizontal direction of the light-emitting structure; and a fifth region formed on the other side of the light-emitting structure in a horizontal direction of the light-emitting structure, the first electrode includes: a first pad on one side of the first conductive semiconductor layer in a longitudinal direction of the first conductive semiconductor layer; a first branch which is formed in the fourth region, is connected to the first pad and extends in the longitudinal direction of the light-emitting structure; and a second branch which is formed in the third region, is connected to the first pad and extends in the longitudinal direction of the light-emitting structure, the second electrode includes: a second pad on the other side of the second conductive semiconductor layer in a longitudinal direction of the second conductive semiconductor layer; and a third branch and a fourth branch which are connected to the second pad and extend in the first pad direction, wherein the first branch is spaced from a first mesa line to separate the third region from the first region, by a first distance, at least one of the third and fourth branches is spaced from a second mesa line to separate the fifth region from the first region, by a second distance, and the second distance is greater than the first distance.

The second distance may be 3% to 15% of the horizontal length of the light-emitting structure.

The second distance may be 20 μm to 80 μm.

The second distance may be 35 μm to 50 μm.

The third branch may be spaced from the first mesa line by a third distance.

The first distance may be the same as the third distance, or may be smaller than the third distance.

The fourth branch may be spaced from the fourth mesa line to separate the first region from the fourth region, by a fourth distance.

The fourth distance may be greater than the third distance.

The first distance may be the same as the fourth distance or may be smaller than the fourth distance.

The at least one of the third and fourth branches may include a bend.

The at least one of the bends may be curved.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
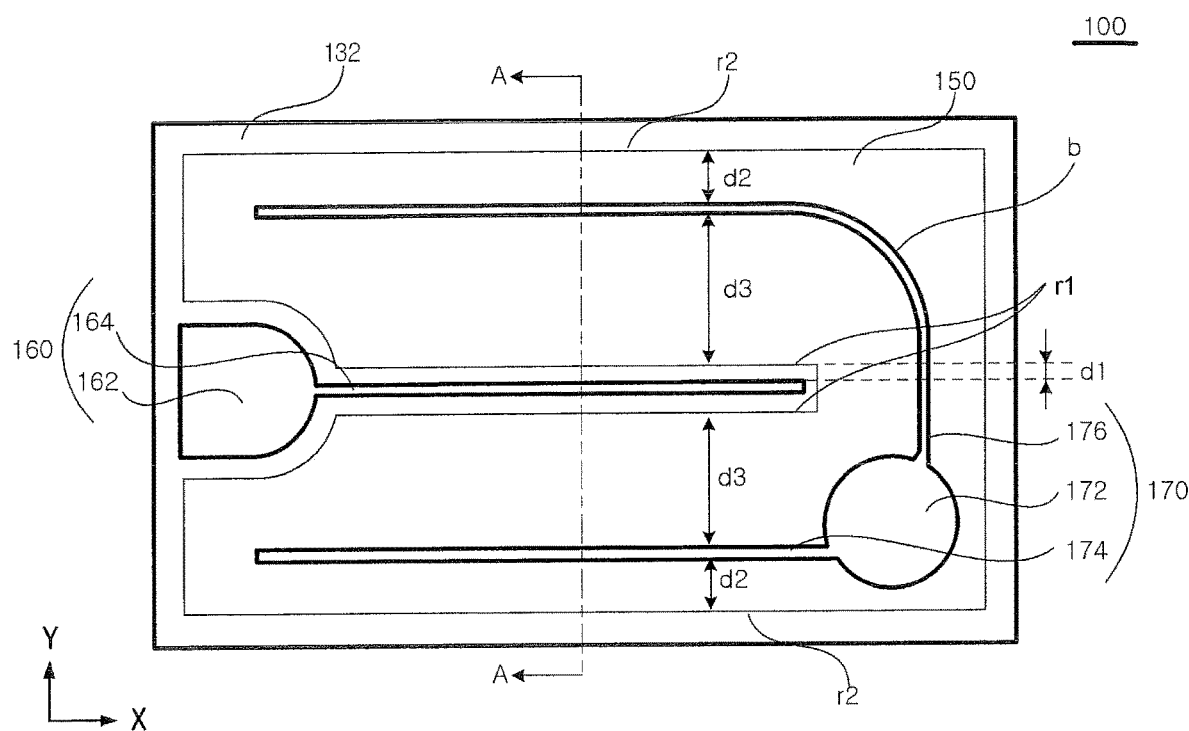
FIG. 1 is a plan view illustrating a nitride semiconductor light-emitting device according to one embodiment.

Reference will now be made in detail to the embodiments of the present invention, examples of which are illustrated in the accompanying drawings. Wherever possible, the same reference numbers will be used throughout the drawings to refer to the same or like parts.

Prior to description of the embodiments, it will be understood that when an element such as a layer (film), region, pattern, or structure is referred to as being formed "on" or "under" another element, such as a substrate, layer (film), region, pad, or pattern, it can be directly "on" or "under" the other element or be indirectly formed with intervening elements therebetween. Further, "on" or "under" of each layer will be described based on illustration in the drawings.

Hereinafter, the present invention will be described in more detail with reference to the annexed drawings.

Figure 2:
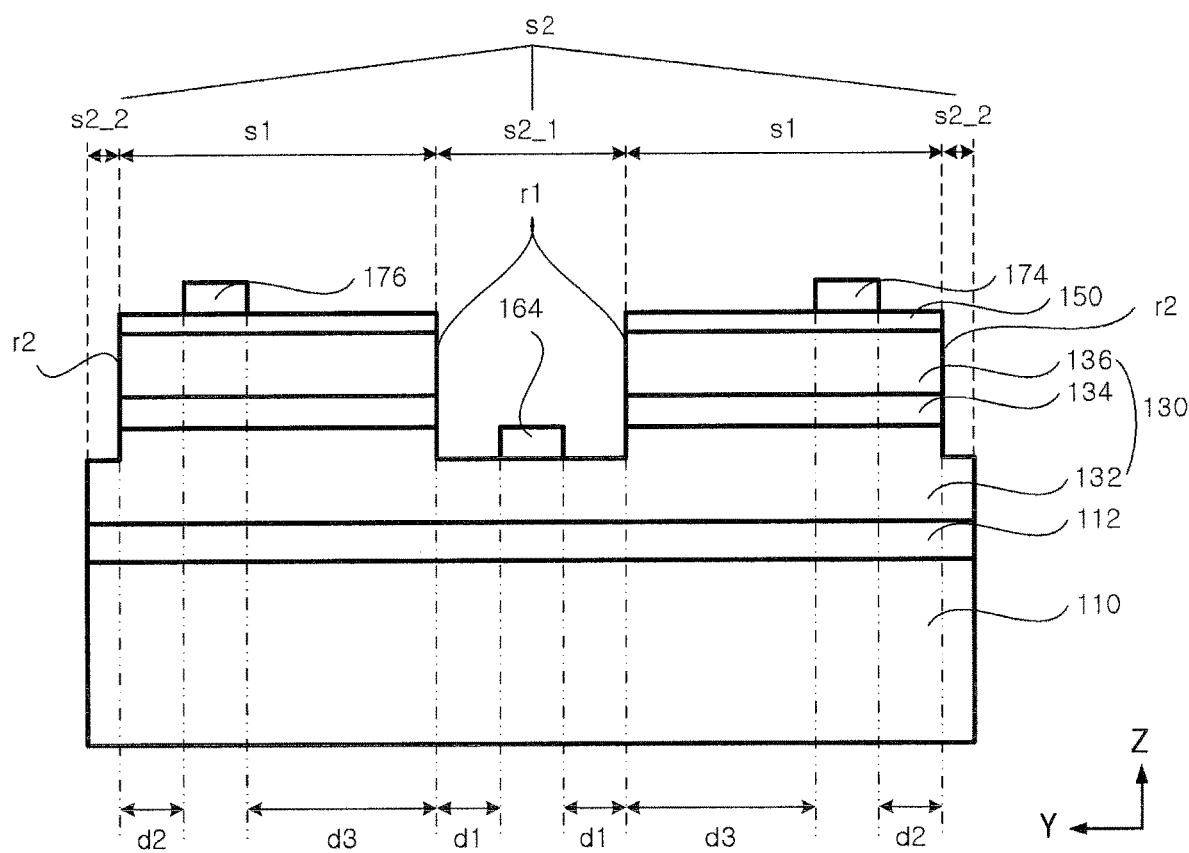
FIG. 2 is a sectional view taken along the line A-A of FIG. 1.

FIG. 1 is a configuration view illustrating a nitride semiconductor light-emitting device according to one embodiment. FIG. 2 is a sectional view taken along the line A-A of FIG. 1.

Meanwhile, hereinafter, for better understanding, the light-emitting device 100 will be described, based on a longitudinal direction X, a horizontal direction Y and a height direction Z.

Referring to FIGS. 1 and 2, the light-emitting device 100 according to one embodiment includes a substrate 110, a buffer layer 112, a light-emitting structure 130 including a first conductive semiconductor layer 132, a second conductive semiconductor layer 136 and an active layer 134 formed between the first and second conductive semiconductor layers 132 and 134, a first electrode 160 and a second electrode 170.

The substrate 110 is made of a light-transmitting material such as sapphire ($Al_2O_3$), GaN, ZnO or AlO and is not limited thereto. In addition, the substrate 110 may be a SiC substrate higher thermal conductivity than sapphire ($Al_2O_3$).

Meanwhile, a patterned substrate (PSS) structure may be provided on the substrate 110 to improve light extraction efficiency. The substrate 110 mentioned herein may or may not have a PSS structure.

The description of this embodiment will be based on the substrate 110 including sapphire.

A buffer layer 112 may be arranged on the substrate 110 to prevent lattice mismatch between the substrate 110 and the first conductive semiconductor layer 132. The buffer layer 112 may be formed under a low temperature atmosphere and be selected from materials such as GaN, InN, AlN, AlInN, InGaN, AlGaN and InAlGaN.

The light-emitting structure 130 including the first conductive semiconductor layer 132, the active layer 134, and the second conductive semiconductor layer 136 may be formed on the buffer layer 112.

The first conductive semiconductor layer 132 may be formed on the buffer layer 112.

The first conductive semiconductor layer 132 may be realized with an n-type semiconductor layer, and the n-type semiconductor layer may be selected from semiconductor materials, such as GaN, AlN, AlGaN, InGaN, InN, InAlGaN, AlInN, having the formula of $In_xAl_yGa_{1-x-y}N$ ($0 \le x \le 1$, $0 \le y \le 1$, $0 \le x+y \le 1$) and may be doped with an n-type dopant such as Si, Ge, Sn, Se or Te.

The first conductive semiconductor layer 132 may supply electrons to the active layer 134, and the first conductive semiconductor layer 132 may be exclusively formed of the first conductive semiconductor layer 132 or may further include a undoped semiconductor layer (not shown), but is not limited thereto.

The undoped semiconductor layer (not shown) is formed to improve crystallinity of the first conductive semiconductor layer 132 and may be the same as the first conductive semiconductor layer 132 except that the undoped semiconductor layer has lower electrical conductivity than the first conductive semiconductor layer 132, since it is not doped with an n-type dopant.

The active layer 134 is formed on the first conductive semiconductor layer 132. The active layer 134 may be formed with a single or multi-quantum well structure, a quantum wire structure, a quantum dot structure or the like using a compound semiconductor material composed of Group III-V elements.

In the case where the active layer 134 has a quantum well structure, for example, it may have a single or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having the formula of $In_aAl_bGa_{1-a-b}N$ ($0 \leq a \leq 1$, $0 \leq b \leq 1$, $0 \leq a+b \leq 1$). The well layer may be formed of a material having a smaller band gap than the barrier layer.

In addition, in the case where the active layer 134 has a multi-quantum well structure, the respective well layers may have different band gaps and thicknesses, and the barrier layers may also have different band gaps and thicknesses, but are not limited thereto.

A conductive clad layer (not shown) may be arranged on and/or under the active layer 134. The conductive clad layer (not shown) may be formed of an AlGaN-based semiconductor, and may have a greater band gap than the active layer 134.

The second conductive semiconductor layer 136 may be formed on the active layer 134. The second conductive semiconductor layer 136 is realized by a p-type semiconductor layer doped with a p-type dopant and may inject holes to the active layer 134. The p-type semiconductor layer may be selected from semiconductor materials having the formula of $In_xAl_yGa_{1-x-y}N$ ($0 \leq x \leq 1$, $0 \leq y \leq 1$, $0 \leq x+y \leq 1$) such as GaN, AlN, AlGaN, InGaN, InN, InAlGaN and AlInN and may be doped with a p-type dopant such as Mg, Zn, Ca, Sr and Ba.

Meanwhile, an intermediate layer (not shown) may be formed between the active layer 134 and the second conductive semiconductor layer 136, and the intermediate layer (not shown) may serve as an electron blocking layer to prevent a phenomenon in which electrons injected from the first conductive semiconductor layer 132 to the active layer 134 do not recombine with holes in the active layer 134 and flow in the second conductive semiconductor layer 136, when a high current is applied thereto. The intermediate layer (not shown) may have a higher band gap than a barrier layer included in the active layer 134 and may be formed of a p-type semiconductor layer containing Al such as AlGaN, without being limited thereto. The intermediate layer (not shown) has a higher band gap than the active layer 134, thus preventing the phenomenon in which electrons injected from the first conductive semiconductor layer 132 do not recombine with holes in the active layer 134 and are injected into the second conductive semiconductor layer 136. As a result, the possibility of recombination between electrons and holes in the active layer 134 can increase and leakage current can be prevented.

The afore-mentioned first conductive semiconductor layer 132, the active layer 134, the intermediate layer (not shown) and the second conductive semiconductor layer 136 may be formed by a method such as metal organic chemical vapor deposition (MOCVD), chemical vapor deposition (CVD), plasma-enhanced chemical vapor deposition (PECVD), molecular beam epitaxy (MBE) and hydride vapor phase epitaxy (HVPE), but the method is not limited thereto.

In addition, the doping concentration of the conductive dopant in the first conductive semiconductor layer 132 and the second conductive semiconductor layer 136 may be uniform or non-uniform. That is, the structure of a plurality of semiconductor layers may be varied and is not limited.

Meanwhile, the light-emitting structure 130 may include a third semiconductor layer (not shown) having a polarity opposite to the first conductive semiconductor layer 132, arranged under the first conductive semiconductor layer 132. In addition, the first conductive semiconductor layer 132 may be realized by a p-type semiconductor layer and the second conductive semiconductor layer 136 may be realized by an n-type semiconductor layer. Accordingly, the light-emitting structure layer 130 may include at least one of N—P, P—N, N—P—N and P—N—P junction structures and is not limited thereto.

That is, although the position of the first conductive semiconductor layer 132 and the second conductive semiconductor layer 136 may be reversed based on the active layer 134, the first conductive semiconductor layer 132 which includes an n-type semiconductor layer and is laminated on the substrate 110 will be described below.

A light-transmitting electrode layer 150 may be formed on the second conductive semiconductor layer 136.

The light-transmitting electrode layer 150 may include at least one of ITO, IZO(In—ZnO), GZO(Ga—ZnO), AZO (Al—ZnO), AGZO(Al—Ga ZnO), IGZO(In—Ga ZnO), IrOx, RuOx, RuOx/ITO, Ni/IrOx/Au and Ni/IrOx/Au/ITO. Accordingly, the light-transmitting electrode layer 150 transmits light emitted from the active layer 134 to the outside, may be formed in at least one region of the outer sides of the second conductive semiconductor layer 136 such that it has a step with the second conductive semiconductor layer 136, or may be formed in the entire regions of the outer sides thereof, and can thus prevent current crowding.

In addition, the first conductive semiconductor layer 132 may include at least a first region and a second region, and the active layer 134 and the second conductive semiconductor layer 136 may be formed in the first region. Meanwhile, the first and second regions can be formed such that the first and second regions are separated from each other by forming the first conductive semiconductor layer 132, the active layer 134 and the second conductive semiconductor layer 136, and removing at least one region of the second conductive semiconductor layer 136 and the active layer 134. At this, time, the removal of at least one region of the second conductive semiconductor layer 136 and the active layer 134 may be carried out using a predetermined etching method such as mesa etching and is not limited thereto.

The second region s2 may include a third region s2_1 formed inside the light-emitting device 100 in a horizontal direction of the light-emitting device 100 and a fourth region s2_2 formed outside the light-emitting device in a horizontal direction of the light-emitting device, and the fourth region s2_2 may be formed on at least one of both sides of the second semiconductor layer 136. In the first embodiment, the fourth region s2_2 is formed on both sides of the second conductive semiconductor layer 136 and is not limited thereto.

In addition, a mesa line to separate the first region s1 from the second region s2 may be formed by removing at least one region of the second conductive semiconductor layer 136 and the active layer 134. The mesa line may include first and second mesa lines r1 and r2 which extend parallel to the longitudinal direction of the light-emitting device 100.

The first mesa line r1 is formed inside the light-emitting device 100 in a horizontal direction thereof to separate the third region s2_1 from the first region s1.

The second mesa line r2 is formed outside the light-emitting device 100 in a horizontal direction thereof to separate the fourth region s2_2 from the first region s1.

In addition, the first electrode 160 may be formed on the first conductive semiconductor layer 132 by forming the second region s2 in the light-emitting structure 130.

The first electrode 160 may include a first pad 162 arranged on one side of the second region s2 and a first branch 164 which is connected to the first pad 162 and extends in the other side direction. At this time, the first branch 164 may be formed in the third region s2_1.

In addition, the second electrode 170 may be formed in the first region s1 where the active layer 134 and the second conductive semiconductor layer 136 are formed.

The second electrode 170 may include a second pad 172 arranged on one side of the second conductive semiconductor layer 136 in the first region s1, and third and fourth branches 174 and 176 which are connected to the second pad 172 and extend toward the first pad 162.

At this time, when seen from the top, the first branch 164 may be arranged between the third and fourth branches 174 and 176. By arranging the first branch 164 between the third and fourth branches 174 and 176, current diffusion can be facilitated and recombination efficiency between electrons and holes can be improved.

In the first embodiment, the first branch 164 of the first electrode 160 may be arranged around the center in a horizontal direction. In this case, the distance of the first branch 164 from the third and fourth branches 174 and 176 may be uniform and current spreading effect can be thus improved.

The first electrode 160 and the second electrode 170 may be formed in a single layer or multi-layer made of a conductive material such as metals or alloys selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi.

Here, the first branch 164 may be spaced from a first mesa line r1 to separate the first region s1 from the third region s2_1 by a first distance d1, and the third and fourth branches 174 and 176 may be spaced from a second mesa line r2 to separate the first region s1 from the fourth region s2_2 by a second distance d2.

The second distance d2 may be longer than the first distance d1, and the third and fourth branches 174 and 176 may be spaced from the first mesa line r1 and the third distance d3, respectively.

That is, the first distance d1 may be shorter than the second and third distances d2 and d3, and the second distance d2 may be shorter than the third distance d3.

Here, the third distance d3 may be 10% to 40% of the horizontal length of the light-emitting device 100. In addition, the second distance d2 may be 3% to 15% of the horizontal length of the light-emitting device 100.

This is the reason that, when the second distance d2 is shorter than 3% of the horizontal length of the light-emitting device 100, the distance between the first branch 164, and the third and fourth branches 174 and 176 increases, forward voltage (Vf) decreases, diffusion of electrons becomes non-uniform and luminous efficacy decreases. In addition, when the second distance d2 is longer than 15% of the horizontal length of the light-emitting device 100, the distance between the first branch 164, and the third and fourth branches 174 and 176 decreases, a current spreading region decreases, recombination between electrons and holes decreases and luminous efficacy decreases.

In addition, the third distance d3 may be 50 μm to 200 μm, and the second distance d2 may be 20 μm to 80 μm. In addition, the second distance d2 may be 35 μm to 50 μm.

This is the reason that, when the second distance d2 is shorter than 20 μm, the distance between the first branch 164, and the third and fourth branches 174 and 176 increases, forward voltage (Vf) decreases, diffusion of electrons becomes non-uniform and luminous efficacy decreases. In addition, when the second distance d2 is longer than 80 μm, the distance between the first branch 164, and the third and fourth branches 174 and 176 decreases, a current spreading region decreases, recombination between electrons and holes decreases and luminous efficacy decreases.

Here, [TABLE 1] shows light output efficiency (%) and forward voltage (Vf) depending on the second distance d2.

TABLE 1

| Second distance (d2) | Forward voltage (Vf) | Light output efficiency (%) |
|---|---|---|
| 10 μm | 3.41 | 24.09 |
| 20 μm | 3.35 | 24.15 |
| 25 μm | 3.32 | 24.89 |
| 35 μm | 3.33 | 25.09 |
| 50 μm | 3.32 | 25.19 |
| 65 μm | 3.34 | 24.48 |
| 75 μm or more | 3.34 | 23.15 |

As can be seen from [TABLE 1], forward voltage (Vf) and light output efficiency (%) may be varied depending on the second distance d2.

That is, in the case where the second distance d2 is 25 μm to 50 μm, the forward voltage (Vf) is maintained at 3.32 V to 3.33V, while in the case where the second distance d2 is 20 μm or less, the forward voltage (Vf) is 3.35 V or more and forward voltage (Vf) increases, and in the case where the second distance d2 is 65 μm or more, the forward voltage (Vf) is also 3.34 V which is higher than the case where the second distance d2 is 25 μm to 50 μm.

In addition, in the case where the second distance d2 is 25 μm to 50 μm, light output efficiency is maintained at 24.89% to 25.19%, while, in the case where the second distance d2 is 20 μm or less, light output efficiency is decreased to 24.15%. Also, in the case where the second distance d2 is 65 μm or more, light output efficiency is decreased to 24.48%.

That is to say, it can be seen from Table 1, that the light output efficiency (%) and forward voltage (Vf) vary, depending on the second distance d2 shown in [TABLE 1], and when the second distance d2 is out of a predetermined range, forward voltage (Vf) increases and light output efficiency (%) decreases.

Accordingly, the second distance d2 may be 20 μm to 80 μm, and the second distance d2 may be 35 μm to 50 μm.

Here, [TABLE 1] shows experimental values obtained by the electrode configuration described in the first embodiment and is not limited thereto.

Meanwhile, although the third and fourth branches 174 and 176 are described as being symmetrical to each other based on the first branch 164, the third and fourth branches 174 and 176 may be asymmetrical to each other, and this configuration is not limited thereto.

In addition, at least one of the third and fourth branches 174 and 176 may include a bend. In the first embodiment, only the third branch 174 includes a bend b, but is not limited thereto.

Although a curved bend is shown in the drawing, the bend may be angled, but is not limited thereto.

Since the bend b is curved, concentration of current and heat generation can be prevented and reliability of the light-emitting device 100 can be thus improved.

Figure 3A:
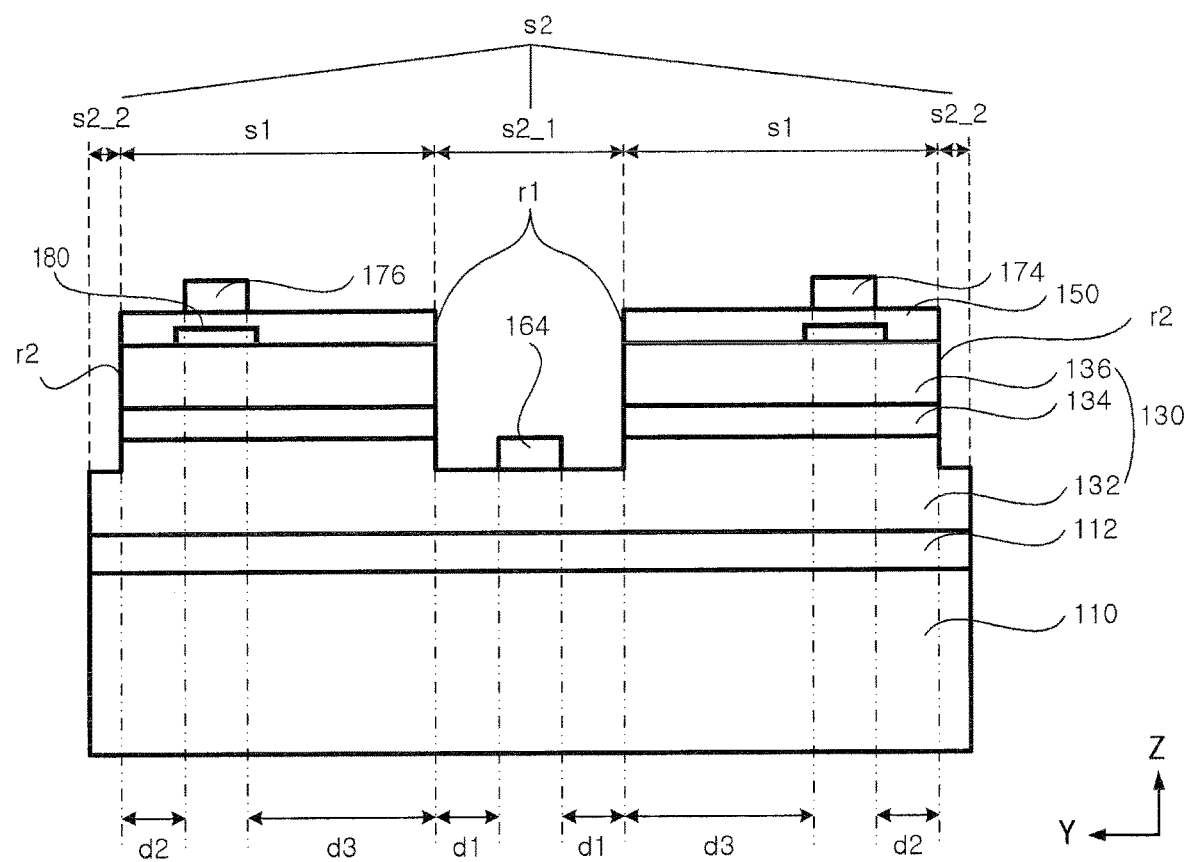
FIG. 3A is a sectional view illustrating the light-emitting device according to another embodiment.
Figure 3B:
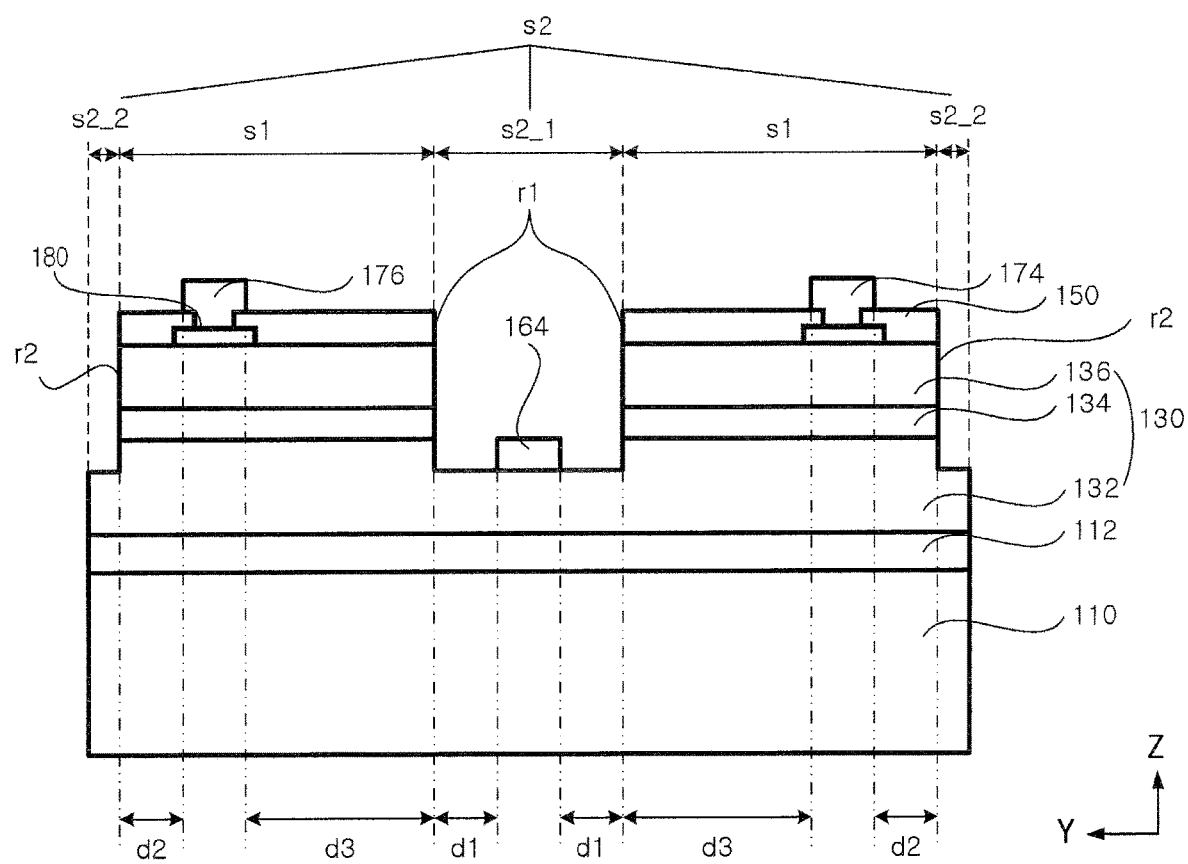
FIG. 3B is a sectional view illustrating the light-emitting device according to another embodiment.

FIGS. 3A and 3B are sectional views illustrating the light-emitting device according to another embodiment.

Referring to FIGS. 3A and 3B, the light-emitting device 100 according to this embodiment may include an insertion layer 180.

The insertion layer 180 may be formed between the second conductive semiconductor layer 136, and at least one of the third and fourth branches 174 and 176, and be formed in the light transmitting electrode layer 150. In addition, at least one region of the insertion layer 180 may vertically overlap at least one of the third and fourth branches 174 and 176, but is not limited thereto.

In addition, as shown in FIG. 3A, the light transmitting electrode layer 150 may be formed between the insertion layer 180, and the third and fourth branches 174 and 176, or, as shown in FIG. 3B, the insertion layer 180 may overlap the third and fourth branches 174 and 176 by partially removing the light transmitting electrode layer 150, but is not limited thereto.

The insertion layer 180 may include at least one of a current blocking layer (not shown) and a reflective layer (not shown).

The current blocking layer (not shown) may transmit light, and may be made of a non-conductive or poorly conductive material.

The current blocking layer (not shown) may include at least one of silicon dioxide ($SiO_2$), and aluminum oxide ($Al_2O_3$) including silicon dioxide ($SiO_2$), but is not limited thereto.

The current blocking layer (not shown) can prevent current crowding, a phenomenon in which current is concentrated under the third and fourth branches 174 and 176.

In addition, the width of the current blocking layer (not shown) may be greater than those of third and fourth branches 174 and 176, but is not limited thereto.

The reflective layer (not shown) may be made of a highly reflective material selected from Ag, Ni, Al, Rh, Pd, Ir, Ru, Mg, Zn, Pt, Au, Hf, Cu and combinations thereof, or formed in a multi-layer structure using the metal and light-transmitting material such as IZO, IZTO, IAZO, IGZO, IGTO, AZO, and ATO. In addition, the reflective layer (not shown) may be laminated in a structure such as IZO/Ni, AZO/Ag, IZO/Ag/Ni, or AZO/Ag/Ni. In addition, the reflective layer (not shown) may be a distributed bragg reflector (DBR) formed by laminating a plurality of layers having different refractive indexes, but is not limited thereto.

The reflective layer (not shown) may be provided in at least one layer, or include a region having a curvature, but is not limited thereto. In addition, the cross-section of the reflective layer 180 may take the shape of polygon, circle or curvature, but is not limited thereto. In addition, the width of the reflective layer (not shown) may be different in respective regions and may have a larger width than the third and fourth branches 174 and 176 to cover the third and fourth branches 174 and 176 in a vertical direction.

Meanwhile, in the case where the insertion layer 180 includes a reflective layer (not shown) and a current blocking layer (not shown), the reflective layer (not shown) may be formed on/under the current blocking layer (not shown), without being limited thereto.

Since the reflective layer (not shown) is formed under the third and fourth branches 174 and 176, absorbance of light generated from the active layer 134 by the third and fourth branches 174 and 176 is prevented and luminous efficacy of the light-emitting device 100 can be further improved.

Figure 4:
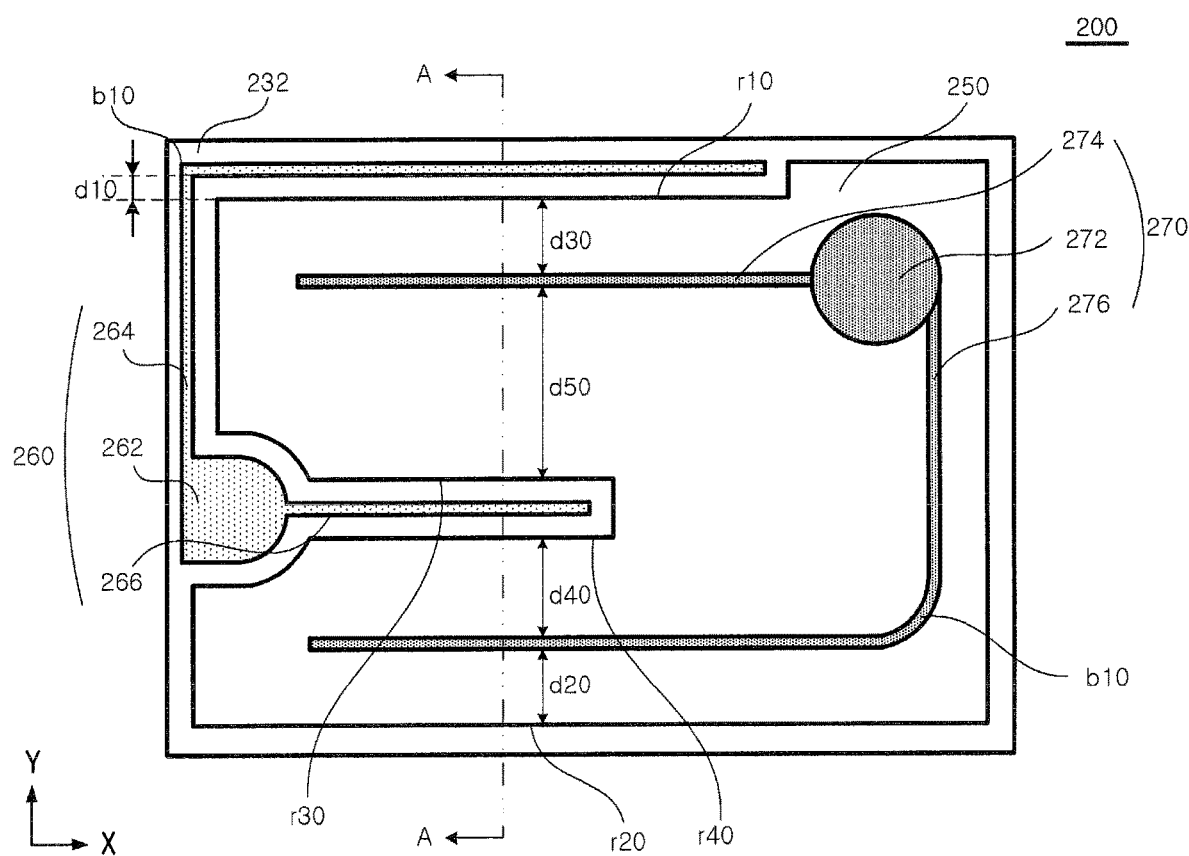
FIG. 4 is a plan view illustrating a nitride semiconductor light-emitting device according to another embodiment.
Figure 5:
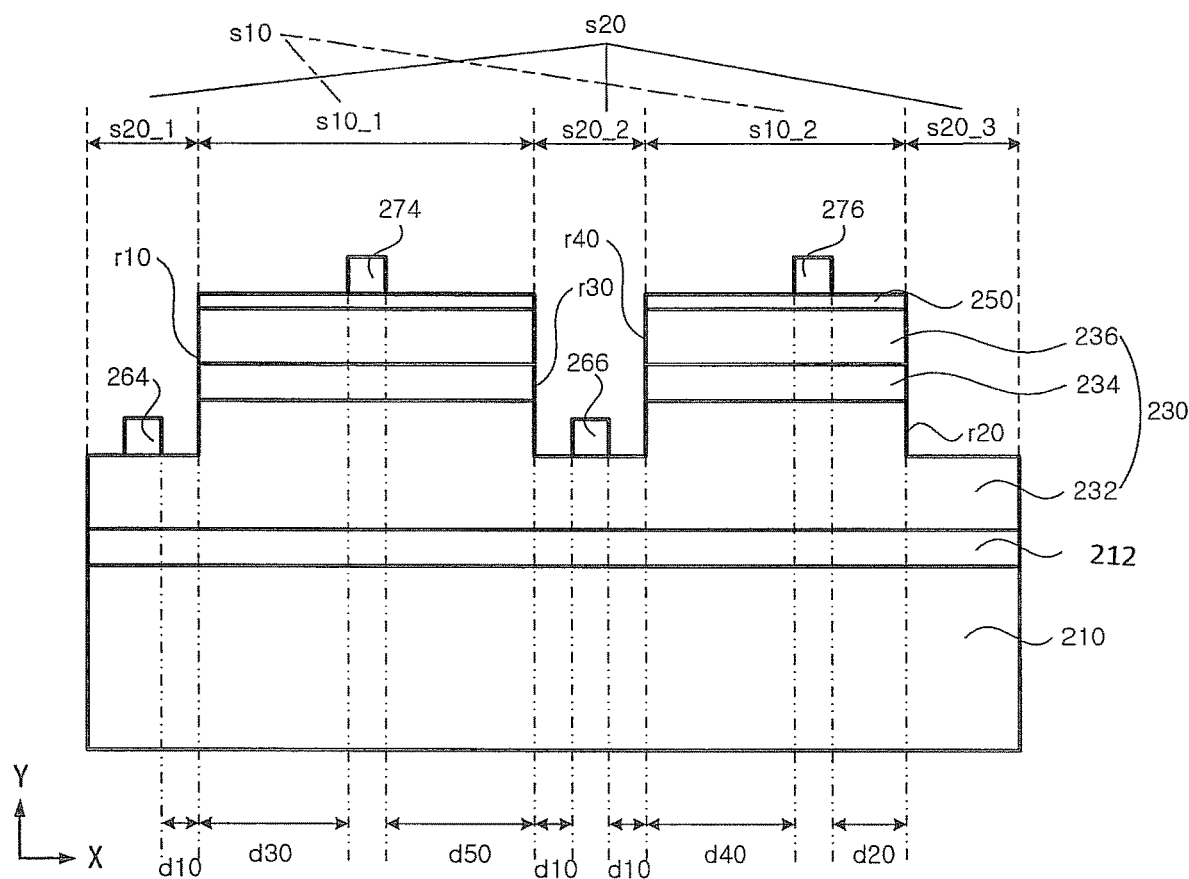
FIG. 5 is a sectional view taken along the line A-A of FIG. 4

FIG. 4 is a configuration view illustrating a nitride semiconductor light-emitting device according to another embodiment. FIG. 5 is a sectional view taken along the line A-A of FIG. 4.

Referring to FIGS. 4 and 5, the light-emitting device 200 according to another embodiment includes a substrate 210, a buffer layer 212, a light-emitting structure 230 including a first conductive semiconductor layer 232, a second conductive semiconductor layer 236 and an active layer 234 formed between the first and second conductive semiconductor layers 232 and 234, a first electrode 260 and a second electrode 270.

The substrate 210 is made of a light-transmitting material such as sapphire ($Al_2O_3$), GaN, ZnO or AlO and is not limited thereto. In addition, the substrate 110 may be a SiC substrate having higher thermal conductivity than sapphire ($Al_2O_3$). Preferably, the refractive index of the substrate 210 is lower than that of the first conductive semiconductor layer 232, in order to improve light extraction efficiency.

Meanwhile, a patterned substrate (PSS) structure may be provided on the substrate 210 to improve light extraction efficiency. The substrate 210 mentioned herein may or may not have a PSS structure.

The description of this embodiment will be based on the substrate 210 including sapphire.

A buffer layer 212 may be arranged on the substrate 210 to prevent lattice mismatch between the substrate 210 and the first conductive semiconductor layer 232. The buffer layer 212 may be formed under a low temperature atmosphere and be selected from materials such as GaN, InN, AlN, AlInN, InGaN, AlGaN and InAlGaN.

The light-emitting structure 230 including the first conductive semiconductor layer 232, the active layer 234, and the second conductive semiconductor layer 236 may be formed on the buffer layer 212.

The first conductive semiconductor layer 232 may be formed on the buffer layer 212.

The first conductive semiconductor layer 232 may be realized as an n-type semiconductor layer, the n-type semiconductor layer may be selected from semiconductor materials, such as GaN, AlN, AlGaN, InGaN, InN, InAlGaN, and AlInN, having the formula of $In_xAl_yGa_{1-x-y}N$ ($0 \leq x \leq 1$, $0 \leq y \leq 1$, $0 \leq x+y \leq 1$) and may be doped with an n-type dopant such as Si, Ge, Sn, Se or Te.

The first conductive semiconductor layer 232 may supply electrons to the active layer 234, the first conductive semiconductor layer 232 may be exclusively formed of the first conductive semiconductor layer 232 or may further include an undoped semiconductor layer (not shown), but is not limited thereto.

The undoped semiconductor layer (not shown) is formed to improve crystallinity of the first conductive semiconductor layer 232 and may be the same as the first conductive semiconductor layer 232 except that the undoped semiconductor layer has lower electrical conductivity than the first conductive semiconductor layer 232, since it is not doped with an n-type dopant.

The active layer 234 is formed on the first conductive semiconductor layer 232. The active layer 234 may be formed so as to have a single or multi-quantum well structure, a quantum wire structure, a quantum dot structure or the like using a compound semiconductor material composed of Group III-V elements.

In the case where the active layer 234 has a quantum well structure, for example, it may have a single or multi-quantum well structure including a well layer having the formula of $In_xAl_yGa_{1-x-y}N$ (0≤x≤1, 0≤y≤1, 0≤x+y≤1) and a barrier layer having the formula of $In_aAl_bGa_{1-a-b}N$ (0≤a≤1, 0≤b≤1, 0≤a+b≤1). The well layer may be formed of a material having a smaller band gap than the barrier layer.

In addition, in the case where the active layer 234 has a multi-quantum well structure, the respective well layers may have different band gaps and thicknesses, and the barrier layers may also have different band gaps and thicknesses, without being limited thereto.

A conductive clad layer (not shown) may be arranged on and/or under the active layer 234. The conductive clad layer (not shown) may be formed of an AlGaN-based semiconductor, and may have a greater band gap than the active layer 234.

The second conductive semiconductor layer 236 may be formed on the active layer 234. The second conductive semiconductor layer 236 is realized as a p-type semiconductor layer doped with a p-type dopant and may inject holes to the active layer 234. The p-type semiconductor layer may be selected from semiconductor materials having the formula of $In_xAl_yGa_{1-x-y}N$ (0≤x≤1, 0≤y≤1, 0≤x+y≤1) such as GaN, AlN, AlGaN, InGaN, InN, InAlGaN and AlInN and may be doped with a p-type dopant such as Mg, Zn, Ca, Sr or Ba.

Meanwhile, an intermediate layer (not shown) may be formed between the active layer 234 and the second conductive semiconductor layer 236 and the intermediate layer (not shown) may serve as an electron blocking layer to prevent a phenomenon in which electrons injected from the first conductive semiconductor layer 232 to the active layer 234 do not recombine with holes in the active layer 234 and flow in the second conductive semiconductor layer 236, when a high current is applied thereto. The intermediate layer (not shown) may have a larger band gap than a barrier layer included in the active layer 234 and may be formed of a p-type semiconductor layer containing Al such as AlGaN, without being limited thereto. The intermediate layer (not shown) has a larger band gap than the active layer 234, thus preventing the phenomenon in which electrons injected from the first conductive semiconductor layer 232 do not combine with holes in the active layer 234 and are injected into the second conductive semiconductor layer 236. As a result, the possibility of recombination between electrons and holes in the active layer 134 can increase and leakage current can be prevented.

The afore-mentioned first conductive semiconductor layer 232, the active layer 234, the intermediate layer (not shown) and the second conductive semiconductor layer 236 may be formed by a method such as metal organic chemical vapor deposition (MOCVD), chemical vapor deposition (CVD), plasma-enhanced chemical vapor deposition (PECVD), molecular beam epitaxy (MBE) and hydride vapor phase epitaxy (HVPE), but the method is not limited thereto.

In addition, the doping concentration of the conductive dopant in the first conductive semiconductor layer 232 and the second conductive semiconductor layer 236 may be uniform or non-uniform. That is, the structure of a plurality of semiconductor layers may be varied and is not limited.

Meanwhile, the light-emitting structure 230 may include a third semiconductor layer (not shown) having a polarity opposite to the first conductive semiconductor layer 232, arranged under the first conductive semiconductor layer 232. In addition, the first conductive semiconductor layer 232 may be realized by a p-type semiconductor layer and the second conductive semiconductor layer 236 may be realized as an n-type semiconductor layer. Accordingly, a light-emitting structure layer 230 may include at least one of N—P, P—N, N—P—N and P—N—P junction structures, and the structure thereof is not limited thereto.

That is, although the position of the first conductive semiconductor layer 232 and the second conductive semiconductor layer 236 may be reversed based on the active layer 234, the first conductive semiconductor layer 232 which includes the n-type semiconductor layer and is laminated on the substrate 210 will be described below.

A light-transmitting electrode layer 250 may be formed on the second conductive semiconductor layer 236.

The light-transmitting electrode layer 250 may include at least one of ITO, IZO(In—ZnO), GZO(Ga—ZnO), AZO (Al—ZnO), AGZO(Al—Ga ZnO), IGZO(In—Ga ZnO), IrOx, RuOx, RuOx/ITO, Ni/IrOx/Au and Ni/IrOx/Au/ITO. Accordingly, the light-transmitting electrode layer 250 can transmit light emitted from the active layer 234 to the outside, may be formed in at least one region of the outer sides of the second conductive semiconductor layer 236, or may be formed in the entire regions of the outer side thereof, and can prevent current crowding.

In addition, the first conductive semiconductor layer 232 may include at least a first region and a second region, and the active layer 234 and the second conductive semiconductor layer 236 may be formed in the first region. Meanwhile, the first and second regions can be formed by forming the first conductive semiconductor layer 232, the active layer 234 and the second conductive semiconductor layer 236, and removing at least one region of the second conductive semiconductor layer 236 and the active layer 234. At this time, the removal of at least one region of the second conductive semiconductor layer 236 and the active layer 234 may be carried out using a predetermined etching method such as mesa etching, without being limited thereto.

The second region s20 may include a third region s20_2 formed inside the light-emitting device 200 in a horizontal direction of the light-emitting device 200, and a fourth region s20_1 and a fifth region s20_3 formed outside the light-emitting device 200 in a horizontal direction of the light-emitting device 200. A second branch 266 may be formed in the third region s20_2, and a first branch 264 may be formed in at least one of the fourth region s20_1 and the fifth region s20_3. In the second embodiment, the first branch 264 is formed in the fourth region s20_1 and the position thereof is not limited thereto.

In addition, a mesa line to separate the first region from the second region may be formed by removing at least one region of the second conductive semiconductor layer 236 and the active layer 234. The mesa line may include first to four mesa lines r10, r20, r30 and r40 which extend parallel to the longitudinal direction of the light-emitting device 200.

The first mesa line r10 is formed on the outside and the top of the light-emitting device 200 in a horizontal direction thereof to separate the third region s20_1 from the first region s10.

The second mesa line r20 is formed on the outside and the top of the light-emitting device 200 in a horizontal direction thereof to separate the fourth region s20_3 from the first region s10.

The third and fourth mesa lines r30 and r40 are formed on the inside of the light-emitting device 200 in a horizontal direction thereof to separate the third region s20_1 from the first region s10.

In addition, the first electrode 260 may be formed on the first conductive semiconductor layer 232 exposed by forming the second region s20 formed in the light-emitting structure 230.

The first electrode 260 may include a first pad 262 arranged on one side of the second region s20, and a first branch 264 and a second branch 266 which are connected to the first pad 262 and extend in the other side direction. At this time, the first branch 264 may be formed in the fourth region s20_1 and the second branch 266 may be formed in the third region s20_2.

In addition, the second electrode 270 may be formed in the first region s10 where the active layer 234 and the second conductive semiconductor layer 236 are formed.

The second electrode 270 may include a second pad 272 arranged on one side of the second conductive semiconductor layer 236 in the first region s10, and third and fourth branches 274 and 276 which are connected to the second pad 272 and extend toward the first pad 262.

At this time, when seen from the top, the third branch 274 may be arranged between the first and second branches 264 and 266, and the second branch 266 may be arranged between the third and fourth branches 274 and 276. Current diffusion can be facilitated and recombination efficiency between electrons and holes can be improved by arranging the third branch 264 between the first and second branches 264 and 266, and arranging the second branch 266 between the third and fourth branches 274 and 276.

The first electrode 260 and the second electrode 270 may be formed in a single layer or multi-layer structure made of a conductive material such as metals or alloys selected from In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi.

Here, the first branch 264 may be spaced from the first mesa line r10 by a first distance d10, and the second branch 266 may also be spaced from the third and fourth mesa lines r30 and r40 by the first distance d10.

In addition, the third branch 274 may be spaced from the first mesa line r10 and the third mesa line r30 by a third distance d30 and a fifth distance d50, respectively. The fourth branch 276 may be spaced from the fourth mesa line r40 and the second mesa line r20 by a third distance d40 and a second distance d20, respectively.

And, the second distance d20 may be longer than the first distance d10 and be shorter than the third, fourth and fifth distances d30, d40 and d50.

The fourth distance d40 may be longer than the third and fifth distances d30 and d50, or be same as at least one of the third and fifth distances d30 and d50.

That is, the second distance d20 may be 3% to 15% of the horizontal length of the light-emitting device 200.

This is the reason that, when the second distance d20 is shorter than 3% of the horizontal length of the light-emitting device 200, the distance between the fourth and second branches 276 and 266 increases, forward voltage (Vf) decreases, diffusion of electrons becomes non-uniform and luminous efficacy decreases. In addition, when the second distance d20 is longer than 15% of the horizontal length of the light-emitting device 100, the distance between the first branch 164, and the third and fourth branches 174 and 176 decreases, a current spreading region decreases, recombination between electrons and holes decreases and luminous efficacy decreases.

In addition, the second distance d20 may be 20 µm to 80 µm.

This is the reason that, when the second distance d20 is shorter than 20 µm, the distance between the fourth branch 276 and the second branch 266 increases, forward voltage (Vf) decreases, diffusion of electrons becomes non-uniform and luminous efficacy decreases. In addition, when the second distance d20 is longer than 80 µm, the distance between the fourth branch 276 and the second branch 266 decreases, a current spreading region decreases, recombination between electrons and holes decreases and luminous efficacy decreases.

In addition, at least one of the third and fourth branches 274 and 276 and at least one of the first and second branches 264 and 266 may include a bend. In the second embodiment, the fourth branch 276 and the first branch 264 include a bend b10. The bend may be curved or a sharp angle. As shown in FIG. 3, the shape of bend b10 may be varied in the first branch 264 and the fourth branch 276, and the shape thereof is not limited.

Since the bend b10 has a curve, concentration of current and heat generation can be prevented and reliability of light-emitting device 200 can be thus improved.

Figure 6A:
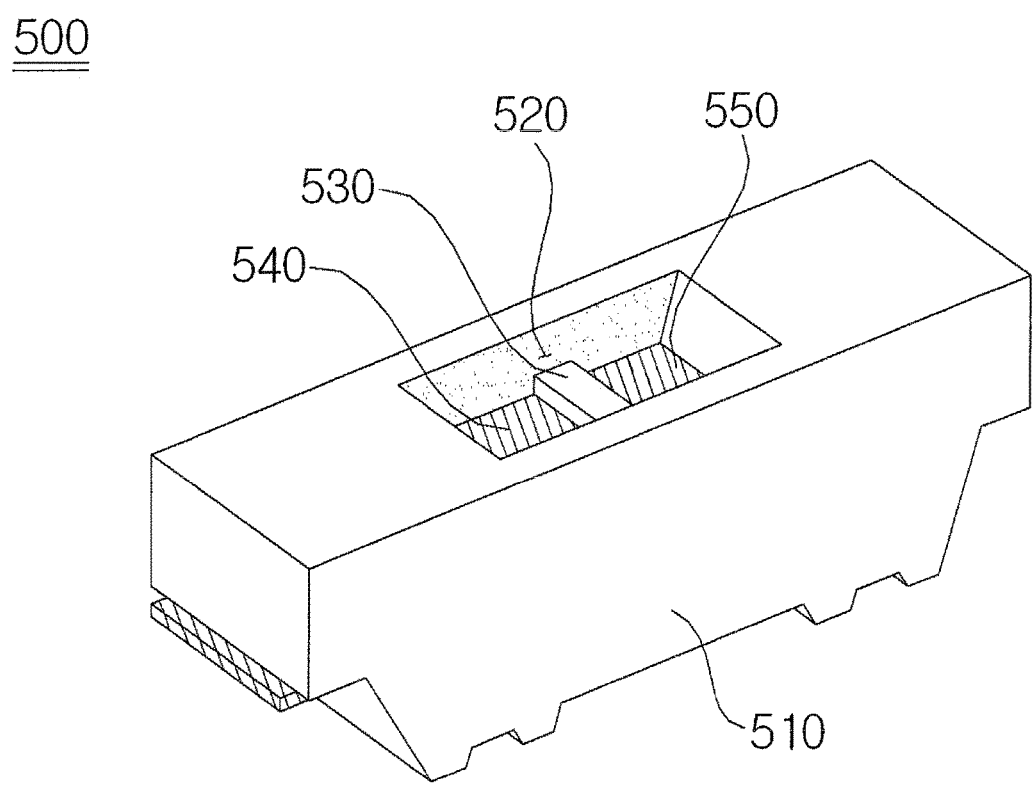
FIG. 6A is a perspective view illustrating a light-emitting device package including the light-emitting device according to another embodiment.
Figure 6B:
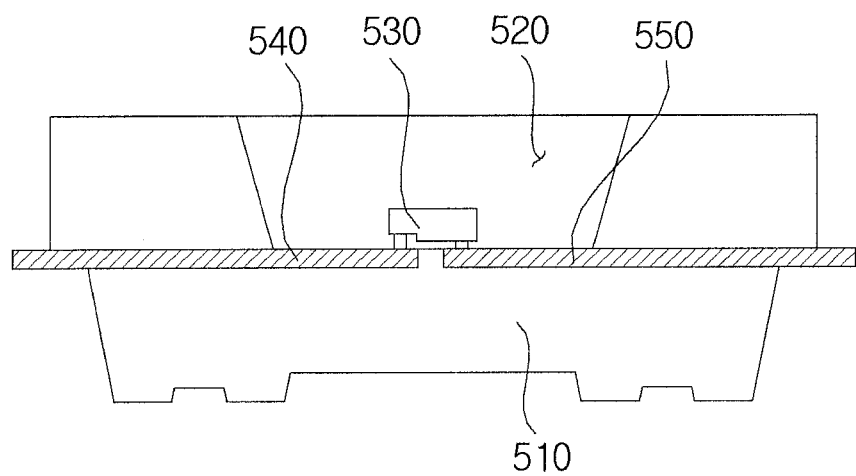
FIG. 6B is a sectional view illustrating a light-emitting device package including the light-emitting device according to the embodiment.
Figure 6C:
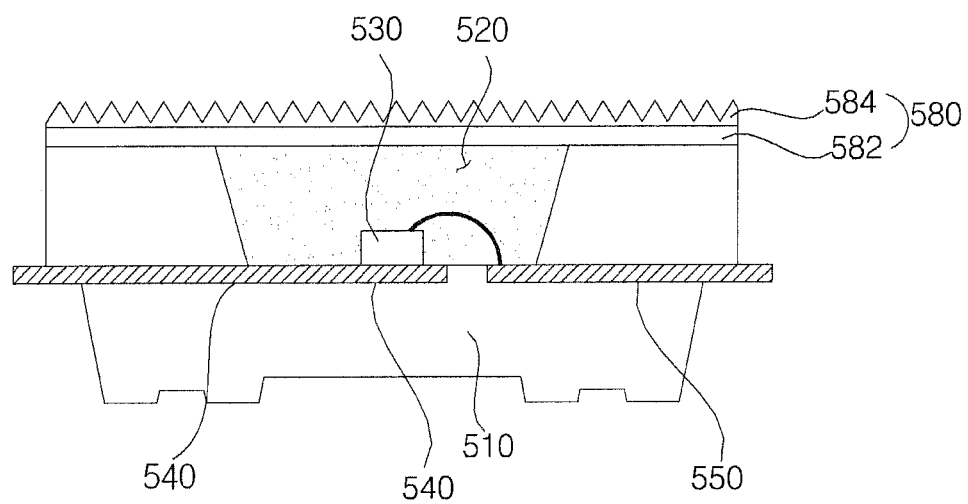
FIG. 6C is a sectional view illustrating a light-emitting device package including the light-emitting device according to the embodiment.

FIGS. 6A to 6C are a perspective view and a sectional view illustrating a light-emitting device package according to another embodiment, respectively.

Referring to FIGS. 6A to 6C, a light-emitting device package 500 includes a body 510 provided with a cavity 520, first and second lead frames 540 and 550 mounted on the body 510, a light-emitting device 530 electrically connected to the first and second lead frames 540 and 550, and a sealant (not shown) filling the cavity 520 to cover the light-emitting device 530.

The body 510 may be composed of at least one selected from resin materials such as polyphthalamide (PPA), silicon (Si), aluminum (Al), aluminum nitride (AlN), photo sensitive glass (PSG), polyamide9T (PA9T), syndiotactic polystyrene (SPS), metal materials, sapphire ($Al_2O_3$), beryllium oxide (BeO) and printed circuit boards (PCB). The body 510 may be formed by a process such as injection molding and etching, without being limited thereto.

The inner surface of the body 510 may be provided with an inclined surface. The reflective angle of light emitted from the light-emitting device 530 may be varied, depending on the angle of the inclined surface. Accordingly, the orientation angle of light discharged to the outside can be controlled.

As the orientation angle of light decreases, convergence of light emitted from the light-emitting device 530 to the outside increases. On the other hand, as the orientation angle of light increases, convergence of light from the light-emitting device 530 to the outside decreases.

Meanwhile, as seen from the top, the cavity 520 provided in the body 510 may have various shapes including, but being not limited to, a circular shape, a rectangular shape, a polygonal shape, an oval shape and a shape with curved corners.

The light-emitting device 530 is mounted on the first lead frame 540 and examples thereof include, but are not limited to, light-emitting devices emitting red, green, blue or white light, and light-emitting devices emitting ultraviolet light. Further, the light-emitting device 530 mounted on the lead frame may be at least one.

Further, the light-emitting device 530 may be applied to all of a horizontal light-emitting device, in which all electrical terminals thereof are formed on the upper surface, a vertical light-emitting device, in which electrical terminals thereof are formed on the upper or lower surface, and a flip chip light-emitting device.

Meanwhile, the light-emitting device 530 according to this embodiment includes an intermediate layer (not shown)

arranged on and/or under the active layer (not shown) to improve luminous efficacy of the light-emitting device 530 and the light-emitting device package 500.

The cavity 520 is filled with the sealant (not shown) such that the sealant covers the light-emitting device 530.

The sealant (not shown) may be composed of silicon, epoxy or other resin materials and may be formed by filling the cavity 520 with a sealant, followed by UV or heat curing.

In addition, the sealant (not shown) may include a phosphor, and the phosphor is selected, considering the wavelength of light emitted from the light-emitting device 530 to allow the light-emitting device package 500 to render white light.

The first and second lead frames 540 and 550 may include a metal material selected from titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and an alloy thereof. In addition, the first and second lead frames 540 and 550 may have a monolayer or multilayer structure, but are not limited thereto.

The first and second lead frames 540 and 550 are spaced from each other and are electrically separated. The light-emitting device 530 is mounted on the first and second lead frames 540 and 550, and the first and second lead frames 540 and 550 directly contact the light-emitting device 530, or are electrically connected thereto through a conductive material such as a soldering member (not shown). In addition, the light-emitting device 530 may be electrically connected to the first and second lead frames 540 and 550 via wire bonding, although the present invention is not limited thereto. Accordingly, when a power source is connected to the first and second lead frames 540 and 550, power may be supplied to the light-emitting device 530. Meanwhile, a plurality of lead frames (not shown) are mounted in the body 510 and respective lead frames (not shown) are electrically connected to the light-emitting device 530, although the present invention is not limited thereto.

Meanwhile, referring to FIG. 6C, the light-emitting device package 500 according to the embodiment may include an optical sheet 580 and the optical sheet 580 may include a base 582 and a prism pattern 584.

The base 582 is a supporter to form the prism pattern 584, which is composed of a transparent material exhibiting superior thermal stability. For example, such a transparent material may be selected from the group consisting of polyethylene terephthalate, polycarbonate, polypropylene, polyethylene, polystyrene and polyepoxy, but is not limited thereto.

In addition, the base 582 may include a phosphor (not shown). For example, the base 582 may be formed by homogenously dispersing a phosphor (not shown) in the material constituting the base 582, followed by curing. When the base 582 is formed according to this method, the phosphor (not shown) can be homogeneously dispersed throughout the base 582.

Meanwhile, a prism pattern 584 to refract and concentrate light may be arranged on the base 582. A material for the prism pattern 584 may be an acrylic resin, without being limited thereto.

The prism pattern 584 includes a plurality of linear prisms arranged in one direction on one surface of the base 582 such that the linear prisms are parallel to one another and the cross-section of the linear prisms taken along an axial direction may take the shape of a triangle.

The prism pattern 584 can concentrate light. For this reason, when the optical sheet 580 is adhered to the light-emitting device package 500 of FIG. 5, straightness of light can be improved and brightness of the light-emitting device package 500 can be thus enhanced.

Meanwhile, the prism pattern 584 may include a phosphor (not shown).

The phosphor (not shown) may be uniformly present in the prism pattern 584 by mixing the phosphor with an acrylic resin which forms the prism pattern 584 in a dispersed state to produce a paste or slurry and then forming the prism pattern 584.

In the case where the phosphor (not shown) is present in the prism pattern 584, light uniformity and distribution level of the light-emitting device package 500 are improved and the orientation angle of light-emitting device package 500 can be thus improved due to dispersion of light by the phosphor (not shown) as well as concentration of light by the prism pattern 584.

The light-emitting device package 500 according to one embodiment is arrayed in plural on the substrate and optical members such as the light guide plate, prism sheet and diffusion sheet may be arranged on a light passage of the light-emitting device package 500. The light-emitting device package, the substrate and the optical members may serve as a light unit. In another embodiment, a display device, an indicating device and a lighting device including the light-emitting device or light-emitting apparatus packages disclosed in the afore-mentioned embodiments may be realized. For example, the lighting apparatus may include a lamp, a streetlamp, or the like.

Figure 7A:
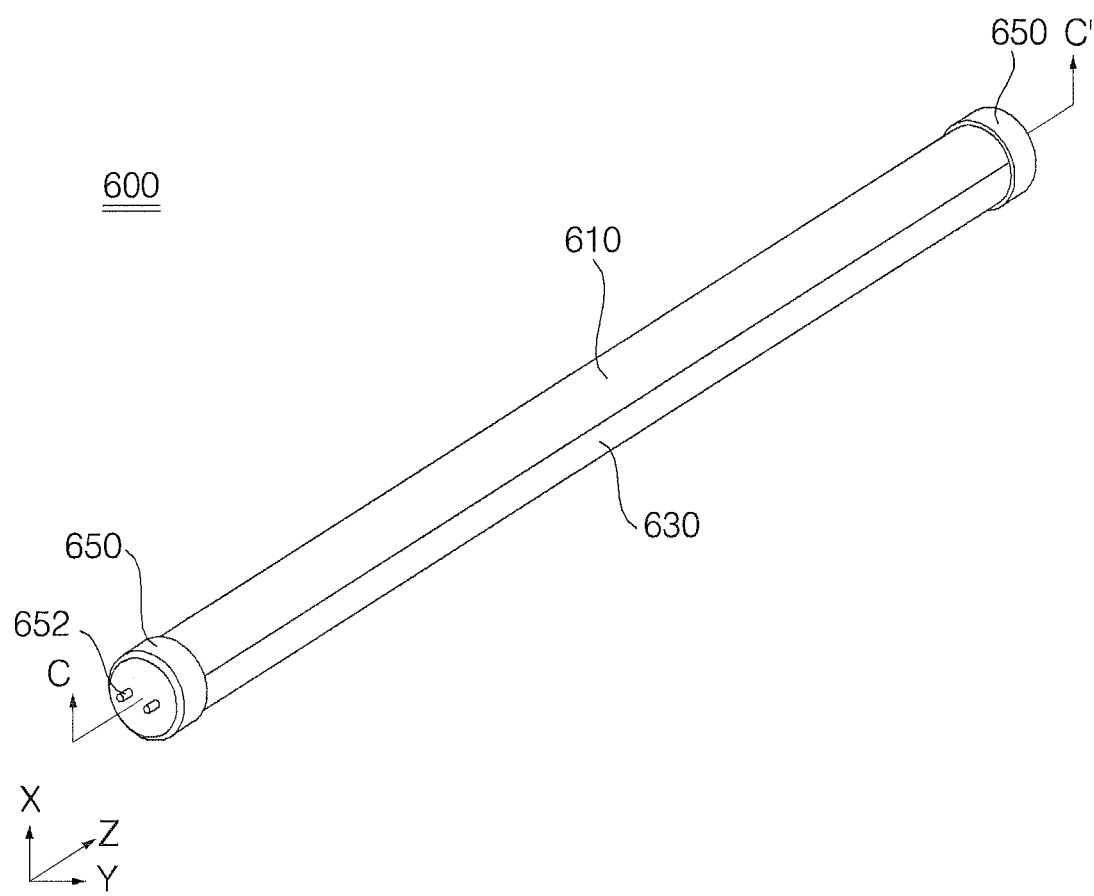
FIG. 7A is a perspective view illustrating a lighting apparatus including the light-emitting device package according to another embodiment.
Figure 7B:
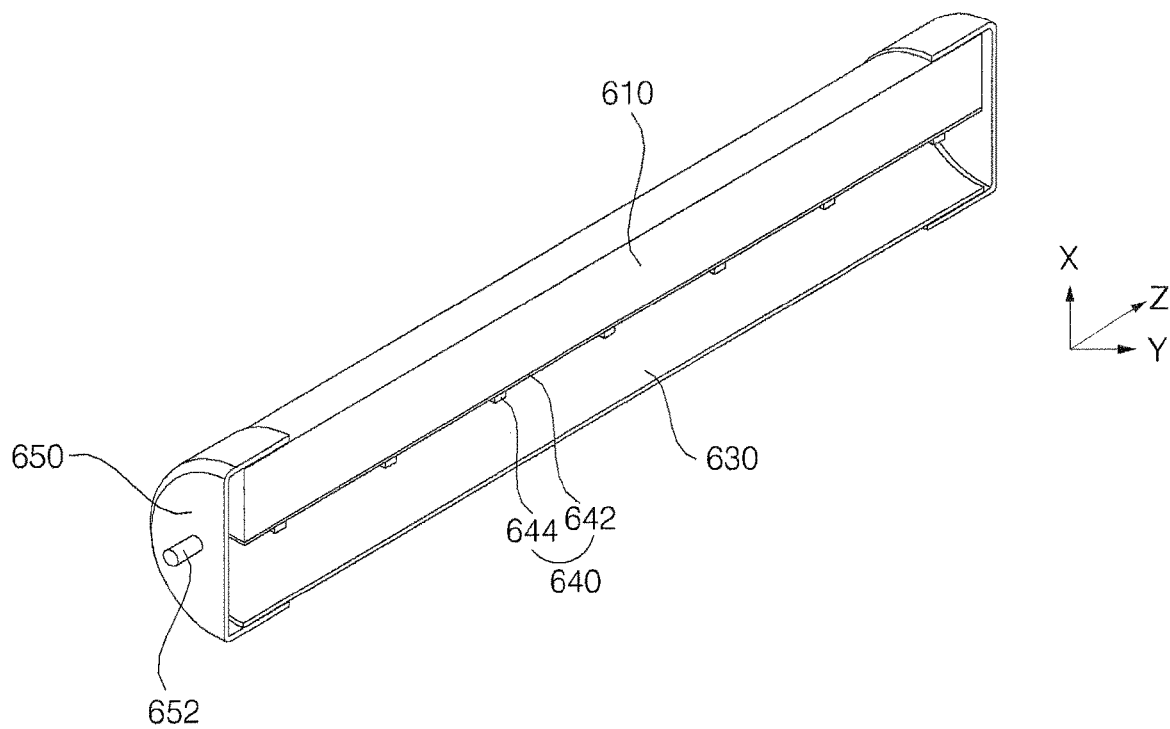
FIG. 7B is a sectional view illustrating a lighting apparatus including the light-emitting device package according to the embodiment.

FIG. 7A is a perspective view illustrating a lighting apparatus including the light-emitting device package according to another embodiment. FIG. 7B is a sectional view illustrating the cross-section taken along the line of C-C' of the lighting apparatus of FIG. 7A.

Referring to FIGS. 7A and 7B, the lighting apparatus 600 may include a body 610, a cover 630 connected to the body 610 and an end cap 650 arranged at both ends of the body 610.

A light-emitting device module 640 is connected to the bottom of the body 610 and the body 610 may be composed of a metal material which exhibits superior conductivity and heat release effects in order to discharge heat generated from the light-emitting device package 644 to the outside through the top of the body 610.

The light-emitting device packages 644 having multiple colors are mounted on the PCB 642 in multiple rows to constitute an array, and may be spaced from one another by a predetermined distance or by different distances, as necessary, to control brightness. The PCB 642 may be a metal core PCB (MPPCB) or PCB made of FR4.

In particular, each light-emitting device package 644 includes a light-emitting device (not shown), and the light-emitting device (not shown) includes a reflective layer (not shown) to improve light extraction efficiency and thereby improve luminous efficacy of the light-emitting device package 644 and the lighting apparatus 600.

The light-emitting device package 644 includes an extended lead frame (not shown) to improve heat radiation and thus enhance reliability and efficiency of the light-emitting device packages 644, and lengthen the lifespan of the light-emitting device package 644 and the lighting apparatus 600 including the light-emitting device package 644.

The cover 630 may take the shape of a circle to surround the bottom of the body 610, without being limited thereto.

The cover 630 protects the light-emitting device module 640 from foreign substances. In addition, the cover 630 prevents glare generated from the light-emitting device package 644 and includes diffusion particles to uniformly discharge light to the outside. In addition, a prism pattern or the like may be formed on at least one of the inner and outer surfaces of the cover 630. Alternatively, a phosphor may be applied onto at least one of the inner and outer surfaces of the cover 630.

Meanwhile, the cover 630 should exhibit superior light transmittance, in order to discharge light generated from the light-emitting device package 644 through the cover 630 to the outside, and the cover 630 should exhibit sufficient heat resistance in order to endure heat emitted by the light-emitting device package 644. Meanwhile, the cover 630 may be composed of a material including polyethylene terephthalate (PET), polycarbonate (PC) or polymethyl methacrylate (PMMA) and the like.

The end cap 650 is arranged on both ends of the body 610 and may be used to seal a power device (not shown). In addition, the end cap 650 is provided with a power pin 652, allowing the lighting apparatus 600 to be applied to a conventional terminal from which a fluorescent light has been removed, without using any additional device.

Figure 8:
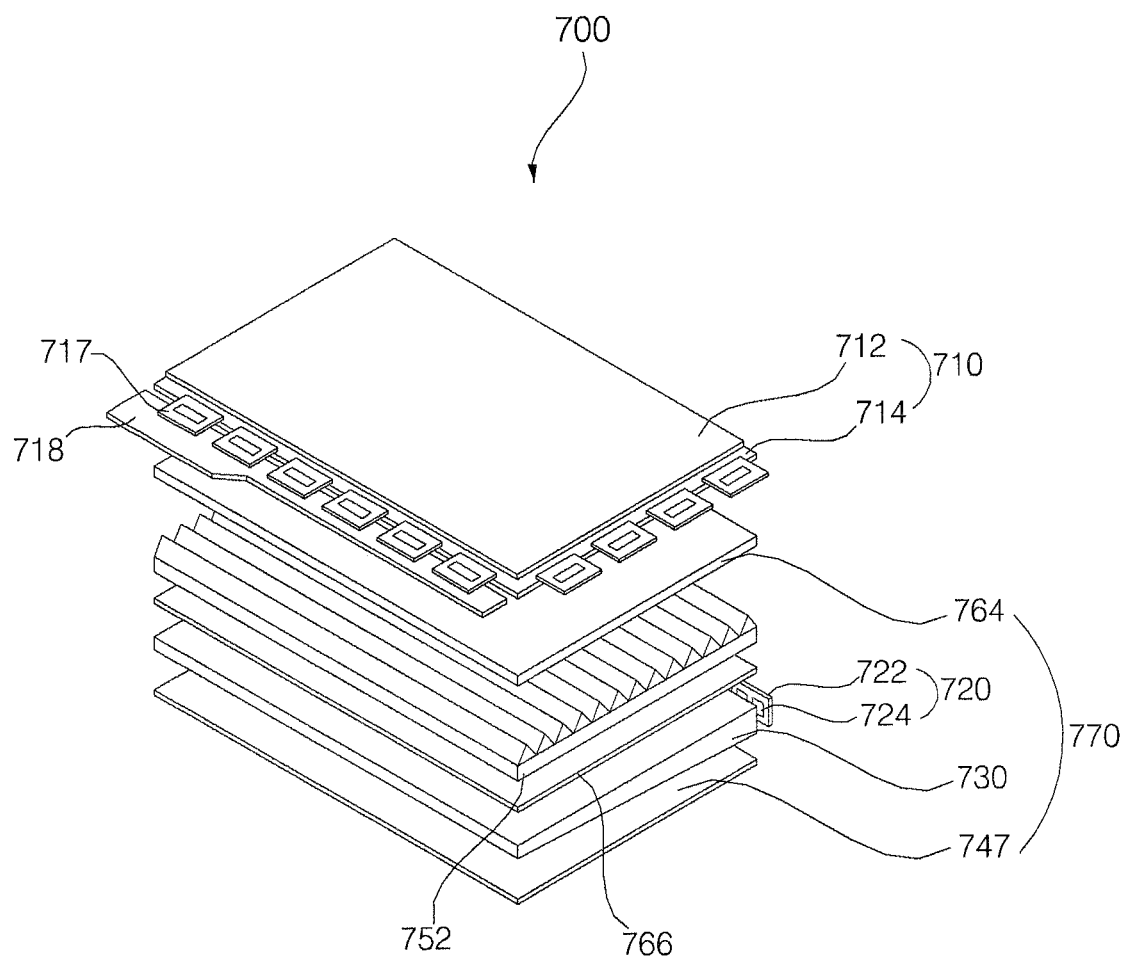
FIG. 8 is an exploded perspective view illustrating a liquid crystal display including the light-emitting device according to another embodiment.

FIG. 8 is an exploded perspective view illustrating a liquid crystal display including the light-emitting device according to another embodiment.

FIG. 8 illustrates an edge-light type liquid crystal display device 700 which includes a liquid crystal display panel 710 and a backlight unit 770 to supply light to the liquid crystal display panel 710.

The liquid crystal display panel 710 displays an image using light supplied from the backlight unit 770. The liquid crystal display panel 710 includes a color filter substrate 712 and a thin film transistor substrate 714 which face each other such that a liquid crystal is interposed therebetween.

The color filter substrate 712 can realize color images to be displayed through the liquid crystal display panel 710.

The thin film transistor substrate 714 is electrically connected to a printed circuit board 718 on which a plurality of circuit components are mounted through a driving film 717. The thin film transistor substrate 714 responds to drive signals supplied from the printed circuit board 718 and may apply drive voltage from the printed circuit board 718 to liquid crystals.

The thin film transistor substrate 714 includes a thin film transistor and a pixel electrode formed as a thin film on other substrates composed of a transparent material such as glass or plastic.

The backlight unit 770 includes a light-emitting device module 720 to emit light, a light guide plate 730 to convert light emitted from the light-emitting device module 720 into a surface light source and supply the light to the liquid crystal display panel 710, a plurality of films 752, 766 and 764 to uniformize brightness of light from the light guide plate 730 and improve vertical incidence, and a reflective sheet 747 to reflect light emitted to the back of the light guide plate 730 to the light guide plate 730.

The light-emitting device module 720 includes a plurality of light-emitting device packages 724 and a PCB 722 on which the light-emitting device packages 724 are mounted to form an array.

In particular, each light-emitting device package 724 includes a light-emitting device (not shown), the light-emitting device (not shown) includes at least one electrode (not shown), the electrode (not shown) includes a plurality of pads (not shown) spaced from one another by a predetermined distance, and a plurality of branches (not shown), to improve current spreading and drive voltage and thereby improve luminous efficacy of the light-emitting device package 724 and the backlight unit 770.

Meanwhile, the backlight unit 770 includes a diffusion film 766 to diffuse light incident from the light guide plate 730 toward the liquid crystal display panel 710, a prism film 752 to concentrate the diffused light and thus improve vertical incidence and a protective film 764 to protect the prism film 752.

Figure 9:
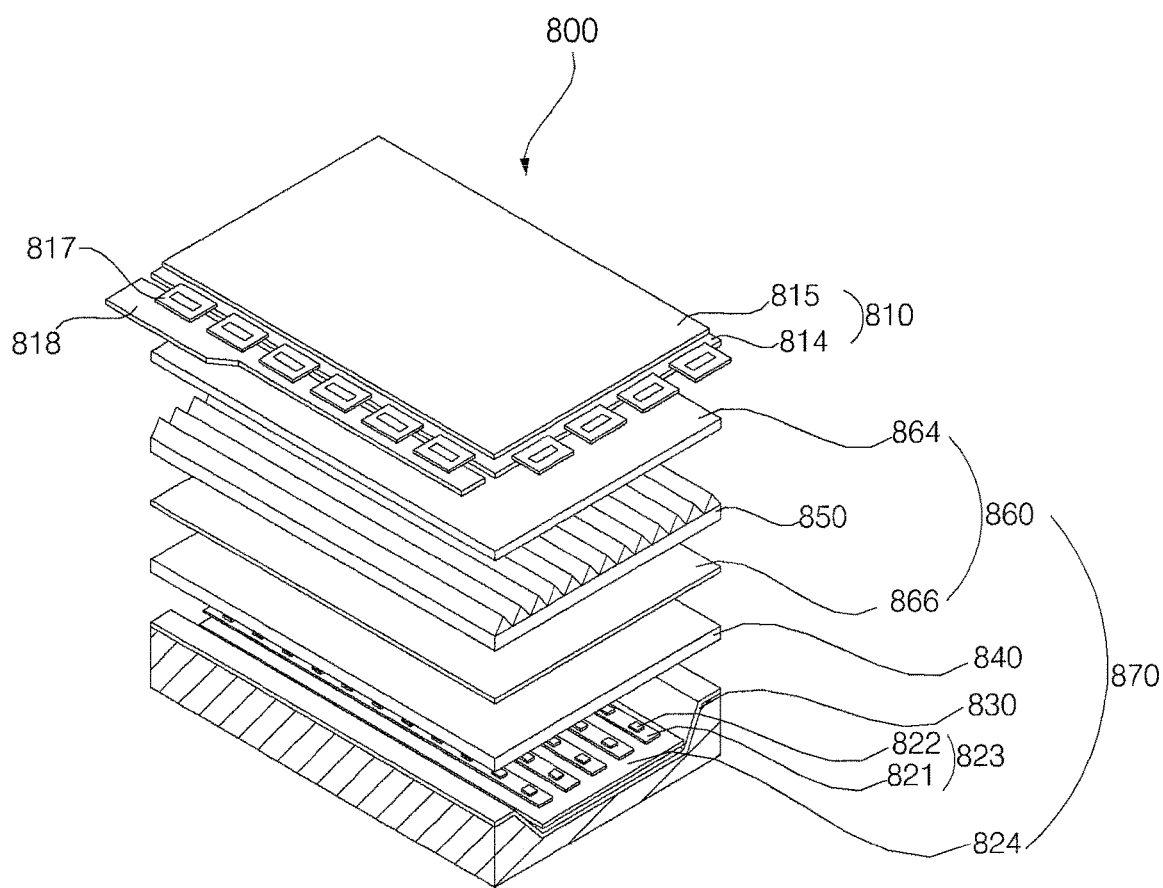
FIG. 9 is an exploded perspective view illustrating a liquid crystal display including the light-emitting device according to another embodiment.

FIG. 9 is an exploded perspective view illustrating a liquid crystal display including the light-emitting device according to another embodiment. The contents illustrated and described in FIG. 8 are not mentioned in detail.

FIG. 9 illustrates a direct-type liquid crystal display device 800 which includes a liquid crystal display panel 810 and a backlight unit 870 to supply light to the liquid crystal display panel 810.

The liquid crystal display panel 810 is described in FIG. 8 and a detailed explanation thereof is omitted. The liquid crystal display panel 810 includes a color filter substrate 815 and a thin film transistor substrate 814. FIG. 9 also shows a driving film 817 and a printed circuit board 818.

The backlight unit 870 includes a plurality of light-emitting device modules 823, a reflective sheet 824, a lower chassis 830 in which the light-emitting device modules 823 and the reflective sheet 824 are accepted, a diffusion plate 840 arranged on the light-emitting device modules 823, and a plurality of optical films 860.

Each light-emitting device module 823 includes a plurality of light-emitting device packages 822 and a PCB 821 on which the light-emitting device packages 822 are mounted to form an array.

In particular, each light-emitting device package 822 includes a light-emitting device (not shown), the light-emitting device (not shown) includes at least one electrode (not shown), the electrode (not shown) includes a plurality of pads (not shown) spaced from one another by a predetermined distance, and at least one branch (not shown), to improve current spreading and drive voltage and thereby improve luminous efficacy of the light-emitting device package 822 and the backlight unit 870.

The reflective sheet 824 reflects light generated from light-emitting device package 822 toward the liquid crystal display panel 810 to improve luminous efficacy.

Meanwhile, light emitted from the light-emitting device module 823 is incident on the diffusion plate 840 and an optical film 860 is arranged on the diffusion plate 840. The optical film 860 includes a diffusion film 866, a prism film 850 and a protective film 864.

The features, structures and effects illustrated in the above embodiments may be included in at least one embodiment of the present invention but are not limited to one embodiment. Further, those skilled in the art will appreciate that various combinations and modifications of the features, structures and effects illustrated in the respective embodiments are possible. Therefore, it will be understood that these combinations and modifications are covered by the scope of the invention.

Although the embodiments of the present invention have been disclosed for illustrative purposes, those skilled in the art will appreciate that various modifications, additions and substitutions are possible, without departing from the scope and spirit of the invention as disclosed in the accompanying claims. For example, the respective elements described in detail in the embodiments may be modified. Further, it will be understood that differences relating to these modifications, additions and substitutions are covered by the scope of the invention defined in the accompanying claims.

What is claimed is:
1. A light-emitting device, comprising:
a substrate;
a light emitting structure disposed on a top surface of the substrate, the light emitting structure including a first conductive semiconductor layer, a second conductive semiconductor layer, and an active layer disposed between the first conductive semiconductor layer and the second conductive semiconductor layer,
the light emitting structure having a first surface, a second surface and a bottom surface, the first surface being a surface of the first conductive semiconductor layer, the second surface being a surface of the second conductive semiconductor layer, wherein the light emitting structure is on the substrate, the bottom surface of the light emitting structure having a width in a first direction and a length in a second direction perpendicular to the first direction, wherein a third direction is perpendicular to the first direction, and the third direction is perpendicular to the second direction;
the first surface of the light emitting structure including a first edge extending in the first direction, a second edge extending in the second direction, a third edge extending the second direction, and a fourth edge extending in the first direction,
the second surface of the light emitting structure including a first edge adjacent to the first edge of the first surface, a second edge adjacent to the second edge of the first surface, a third edge adjacent to the third edge of the first surface, and a fourth edge adjacent to the fourth edge of the first surface;
a first electrode electrically connected to the first conductive semiconductor layer, the first electrode including a first pad disposed on a central portion of the light emitting structure with reference to the first direction, and a first branch extending from the first pad in the second direction and having a linear shape that extends in the second direction, the first pad of the first electrode including a linear edge parallel to the first edge of the first surface of the light emitting structure, wherein a width of the first branch in the first direction is uniform along an entire length of the first branch in the second direction, wherein a width of the first pad in the first direction is greater than the width of the first branch in the first direction;
a second electrode electrically connected to the second conductive semiconductor layer, the second electrode including a second pad disposed adjacent to the third edge of the second surface and adjacent to the fourth edge of the second surface, a third branch, and a fourth branch extended from the second pad, respectively, wherein when viewing a top of the light-emitting device in the third direction, the first branch is not aligned in the second direction with the second pad, the first branch is between the third branch and the fourth branch;
the fourth branch including a linear portion extended in the second direction adjacent to the second edge of the second surface of the light emitting structure and having a predetermined width in the first direction, the third branch including a linear portion extended in the second direction adjacent to the third edge of the second surface of the light emitting structure, wherein the third edge of the second surface is opposite to the second edge of the second surface,
the second pad having a circular shape, wherein a width of the linear portion of the third branch in the first direction is uniform along an entirety of the linear portion of the third branch in the second direction, a width of the second pad in the first direction is greater than the width of the linear portion of the third branch in the first direction; and
a current blocking layer disposed between the second conductive semiconductor layer and at least one of the third branch and the fourth branch of the second electrode, a width of the current blocking layer in the first direction being larger than the width of the linear portion of the third branch in the first direction,
wherein a distance, in the first direction, between the second edge of the second surface of the light emitting structure and the linear portion of the fourth branch of the second electrode is in a range from 3% to 15% of the width of the bottom surface of the light emitting structure,
wherein the second surface of the light emitting structure includes a first mesa line parallel to the first branch of the first electrode,
wherein a distance, in the first direction, between the linear portion of the fourth branch of the second electrode and the first mesa line of the second surface of the light emitting structure is in a range of 10% to 40% of the width of the bottom surface of the light emitting structure,
wherein the first pad includes a linear portion of the first pad, wherein when viewing the top of the light-emitting device in the third direction, an end of the linear portion of the third branch of the second electrode is aligned in the first direction with the first pad, and
wherein the linear portion of the third branch of the second electrode extends along and adjacent to the third edge of the second surface in the second direction and contacts the second pad of the second electrode.

* * * * *